United States Patent
Stella et al.

(10) Patent No.: US 10,756,002 B2
(45) Date of Patent: Aug. 25, 2020

(54) PACKAGED POWER DEVICE HAVING IMPROVED HEAT DISSIPATION CAPACITY AND BETTER THERMAL PERFORMANCES

(71) Applicant: STMICROELECTRONICS S.R.L., Agrate Brianza (IT)

(72) Inventors: Cristiano Gianluca Stella, San Gregorio di Catania (IT); Francesco Salamone, Acireale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/239,333

(22) Filed: Jan. 3, 2019

(65) Prior Publication Data
US 2019/0221500 A1    Jul. 18, 2019

(30) Foreign Application Priority Data

Jan. 15, 2018   (IT) .................. 102018000000950

(51) Int. Cl.
| | |
|---|---|
| *H01L 23/473* | (2006.01) |
| *H01L 23/367* | (2006.01) |
| *H01L 23/433* | (2006.01) |
| *H01L 23/04* | (2006.01) |
| *H01L 23/40* | (2006.01) |
| *H01L 23/373* | (2006.01) |

(52) U.S. Cl.
CPC ............ *H01L 23/473* (2013.01); *H01L 23/04* (2013.01); *H01L 23/041* (2013.01); *H01L 23/3672* (2013.01); *H01L 23/3736* (2013.01); *H01L 23/4006* (2013.01); *H01L 23/433* (2013.01)

(58) Field of Classification Search
CPC ............... H01L 23/5385; H01L 23/488; H01L 23/3675; H01L 23/427; H01L 23/473; H01L 23/3677; H01L 23/5389; H01L 23/34; H01L 23/46; H01L 23/467
See application file for complete search history.

(56) References Cited

U.S. PATENT DOCUMENTS

| | | | |
|---|---|---|---|
| 6,016,007 A * | 1/2000 | Sanger | H01L 23/473 257/706 |
| 7,940,526 B2 | 5/2011 | Schulz-Harder et al. | |
| 9,633,926 B2 | 4/2017 | Takano | |
| 2009/0294954 A1* | 12/2009 | Bakir | H01L 23/473 257/713 |

FOREIGN PATENT DOCUMENTS

| | | |
|---|---|---|
| DE | 102005048492 A1 | 4/2007 |
| DE | 102015114341 A1 | 3/2016 |
| EP | 0709885 A2 | 5/1996 |

* cited by examiner

*Primary Examiner* — Caridad Everhart
(74) *Attorney, Agent, or Firm* — Seed Intellectual Property Law Group LLP

(57) ABSTRACT

A packaged device, having a package, including a first dissipative region, a second dissipative region, a first connection element and a second connection element. A die of semiconductor material is arranged within the package, carried by the first dissipative region. The first and second dissipative regions extend at a distance from each other, and the first and second connection elements extend at a distance from each other between the first and second dissipative regions. The first dissipative region, the second dissipative region, the first connection element, and the second connection element are hollow and form a circuit containing a cooling liquid.

23 Claims, 5 Drawing Sheets

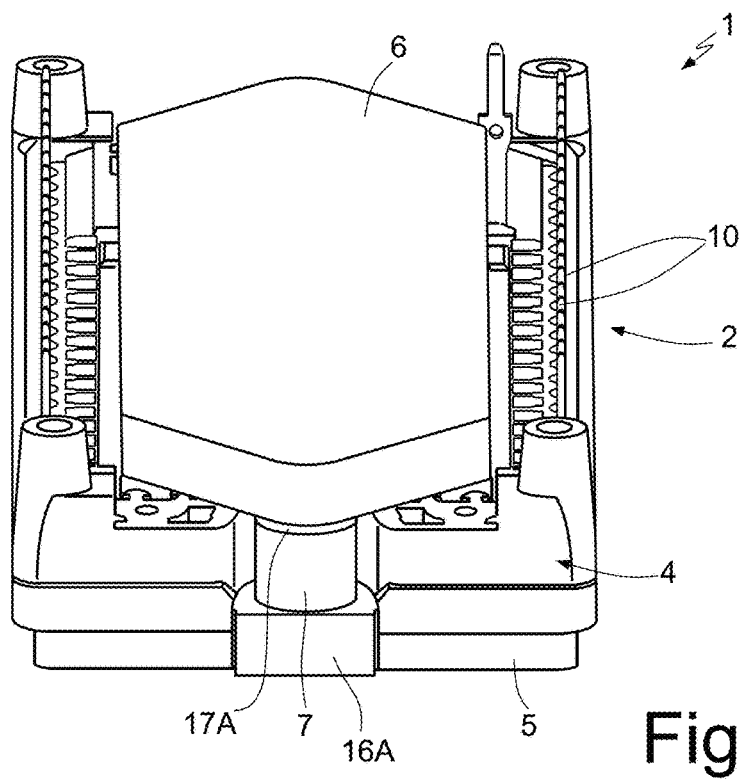
Fig.4
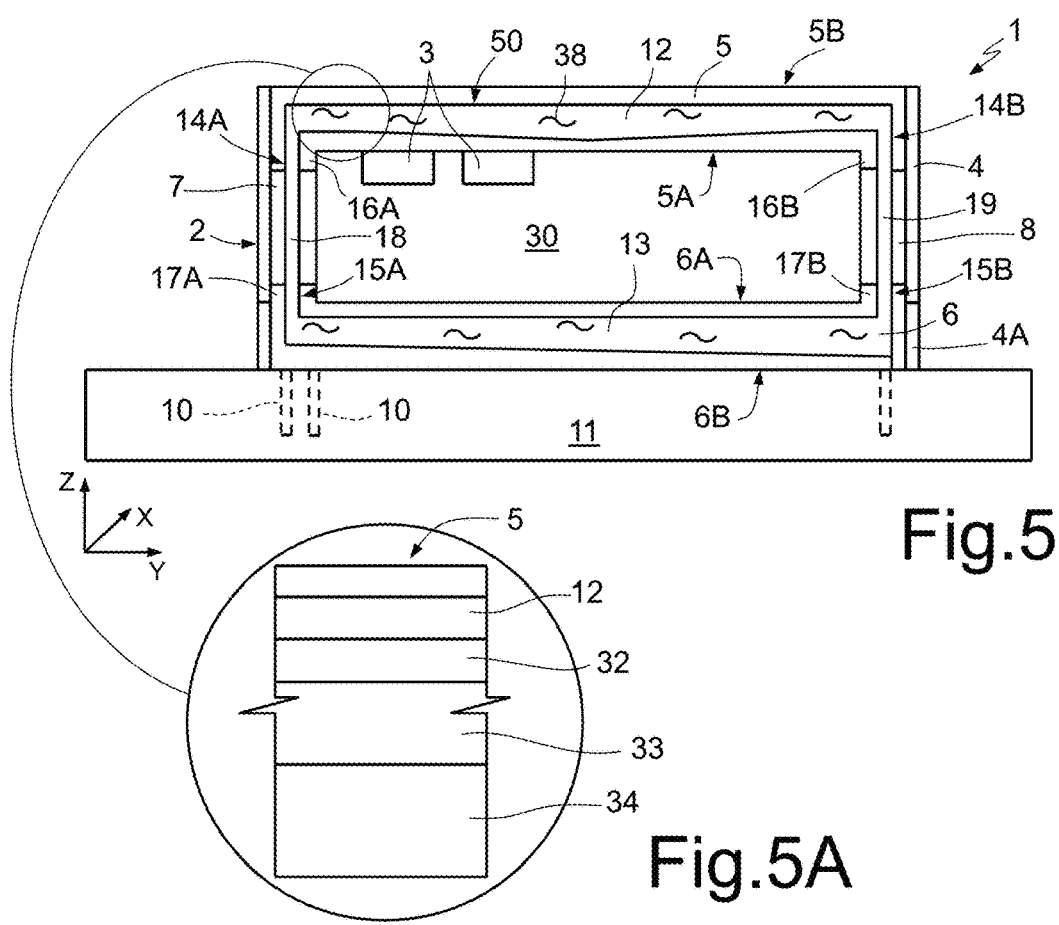
Fig.5
Fig.5A

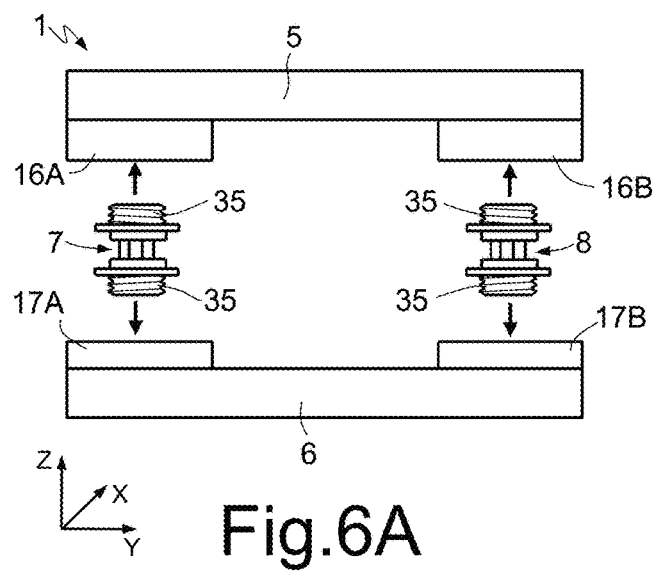
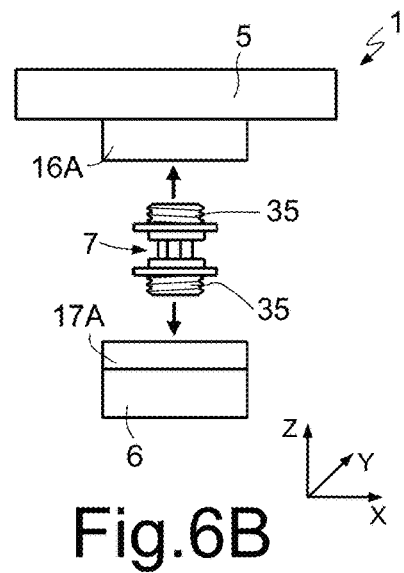
Fig.6A          Fig.6B
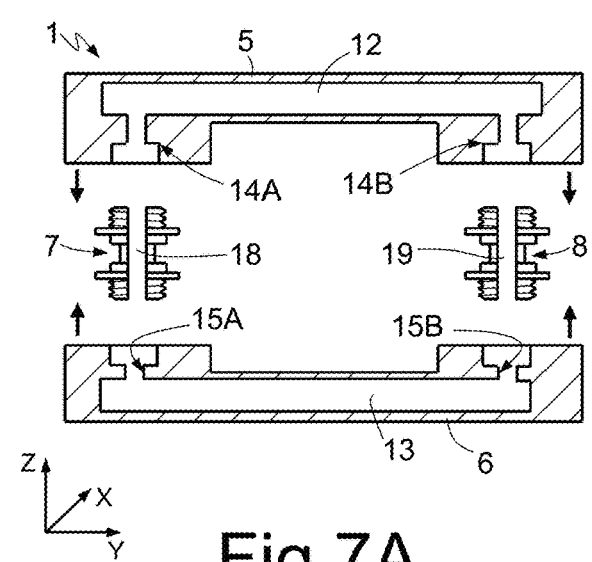
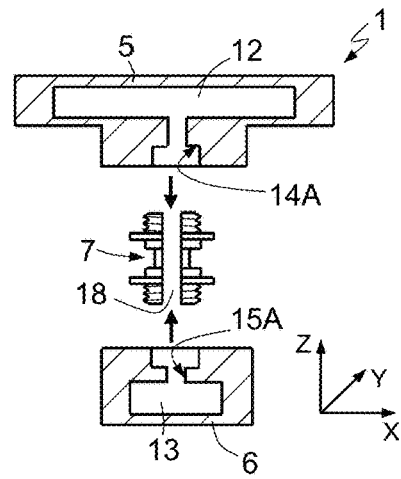
Fig.7A          Fig.7B
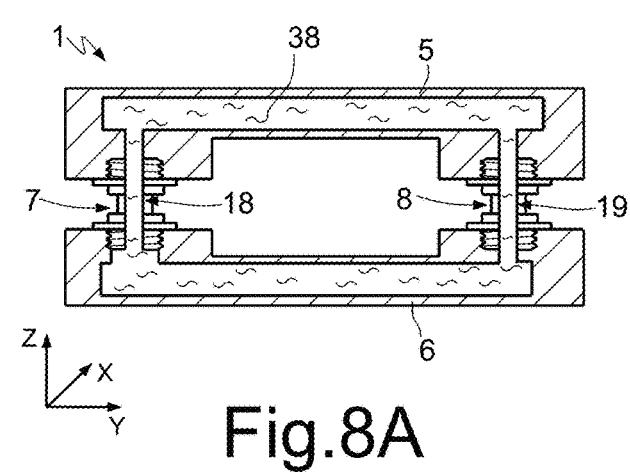
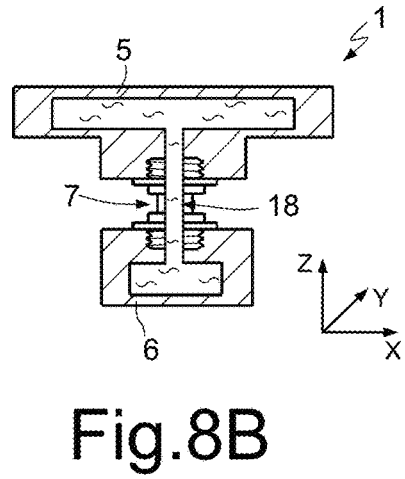
Fig.8A          Fig.8B

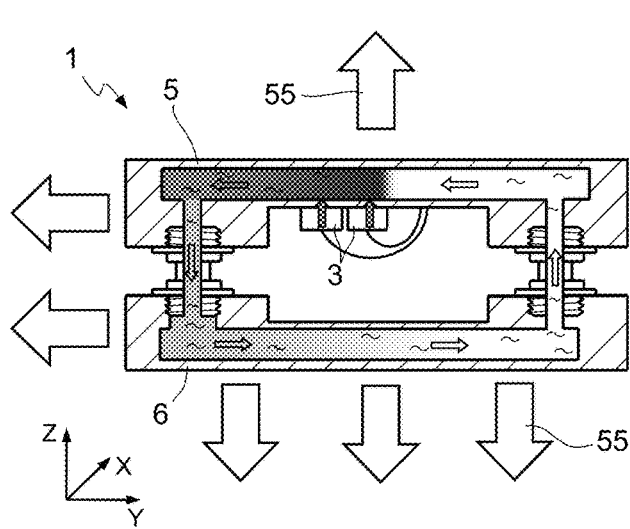
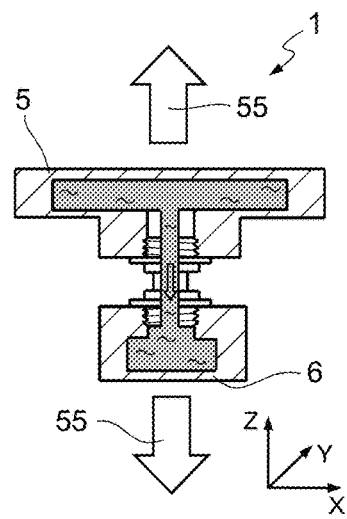
Fig.10A    Fig.10B
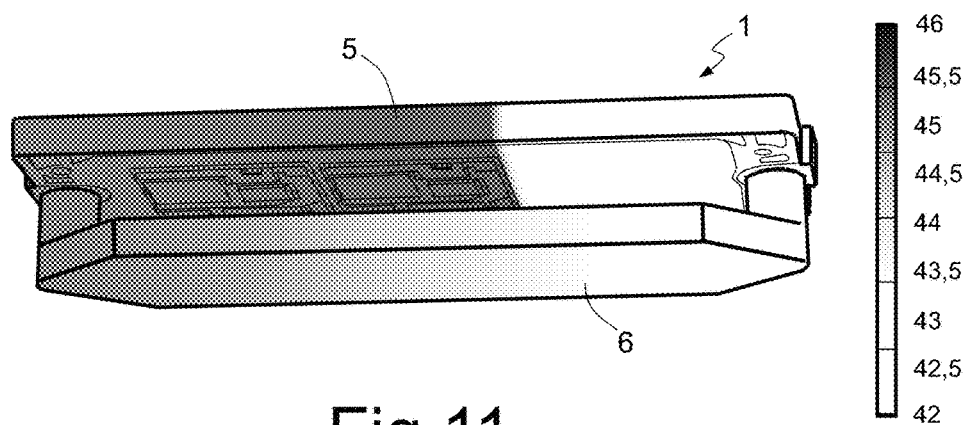
Fig.11
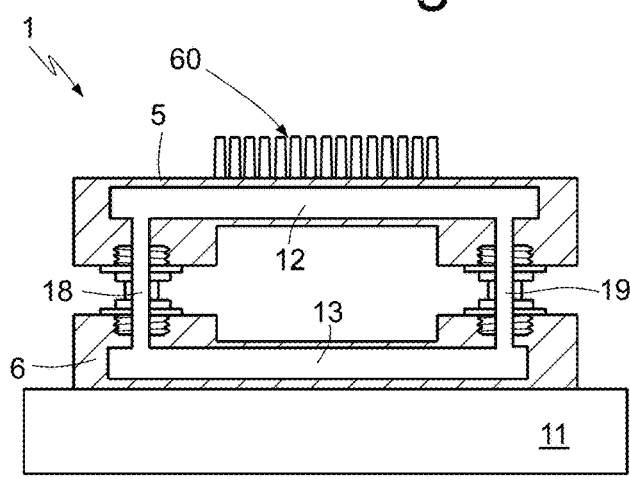
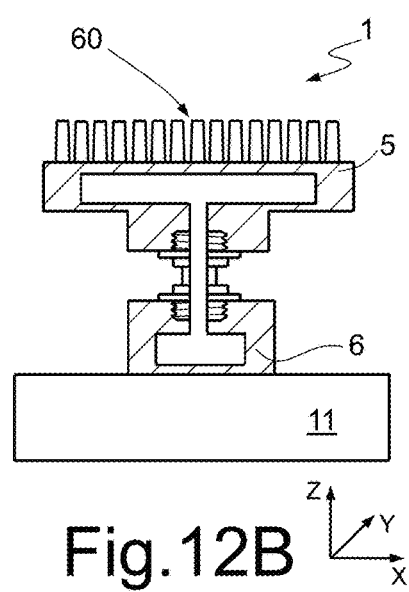
Fig.12A    Fig.12B

PACKAGED POWER DEVICE HAVING IMPROVED HEAT DISSIPATION CAPACITY AND BETTER THERMAL PERFORMANCES

BACKGROUND

Technical Field

The present disclosure relates to a packaged power device having improved heat dissipation capacity and better thermal performances.

Description of the Related Art

Known electronic circuits (such as AC-DC converters, DC-DC converters, and DC-AC inverters) are used for transferring energy from a DC or AC generator (for example, the power mains supply) to DC loads, possibly simultaneously converting characteristics of the voltage and/or current.

Unlike linear power supplies, the pass transistor of a switching-mode supply continues to switch between low-dissipation states, completely off states and completely on states, and remain in a transition condition, which is highly dissipative, for a short time, thus minimizing any waste of energy. These switches are frequently formed by a single silicon or silicon-carbide die that may be inserted in a single package in discrete solutions and discrete circuit topologies or may be assembled as a single die within larger modular package solutions, able to house entire circuit topologies, such as half-bridge or full-bridge inverters/converters.

In both solutions, notwithstanding the measures for reducing consumption and thus waste of energy, some packaged devices may present high-power operation periods, in which dissipation of high amounts of heat is desired.

To this end, packages of high-power devices are shaped and mounted so as to favor dissipation, typically by increasing the dissipative surface and/or favoring the heat transfer. For example, power devices are usually provided with dissipative structures known as heat sinks formed by laminar plates or projections in contact with the package, which increases the dissipative surface. Other solutions may envisage so-called cooling boxes, i.e., hollow structures bonded to the outside of the package and traversed by a fluid, for instance, a cooling liquid, moved using an electric pump to increase heat-extraction efficiency.

Both solutions entail a considerable volume increase of the integrated device and of its packaging and heat-sink structure. However, in some applications, this is undesirable. For example, when the integrated electronic power devices are used in electrical systems in the automotive field or in portable electronic apparatus, it is desirable to reduce as much as possible the size and weight of the integrated devices and increase as far as possible the packing density thereof. In this case, and anyway in general, the use of integrated electronic power devices in apparatus and systems of small overall dimensions and bulk conflicts with the need for highly dissipative surfaces.

BRIEF SUMMARY

One or more embodiments are directed to a semiconductor package. In at least one embodiment, the semiconductor packages described herein provide an improved dissipation efficiency to obtain a bulk reduction and/or a higher dissipative capacity.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein:

FIG. 4 is a bottom perspective view, with parts removed, of the packaged device of FIGS. 1-3;

FIG. 5 is a cross-section of the packaged device of FIGS. 1-4;

FIG. 5A shows an enlarged detail of the packaged device of FIG. 5;

FIGS. 6A and 6B are lateral views taken at 90° to each other of the packaged device of FIGS. 1-5 during assembling;

FIGS. 7A and 7B are schematic cross-sections, taken from the same directions as FIGS. 6A and 6B, of the packaged device of FIGS. 1-5 in the same assembly step as FIGS. 6A and 6B;

FIGS. 8A and 8B are schematic cross-sections similar to those of FIGS. 7A and 7B at the end of assembly;

FIGS. 10A and 10B are schematic cross-sections similar to those of FIGS. 8A and 8B, showing heat dispersion of the present packaged device;

FIG. 11 shows, in a bottom schematic perspective view with parts removed, the thermal dissipation behavior of the packaged device of FIGS. 1-5; and FIGS. 12A and 12B are schematic cross-sections similar to those of FIGS. 8A and 8B of a different embodiment of the present packaged device.

DETAILED DESCRIPTION

Figure 1:
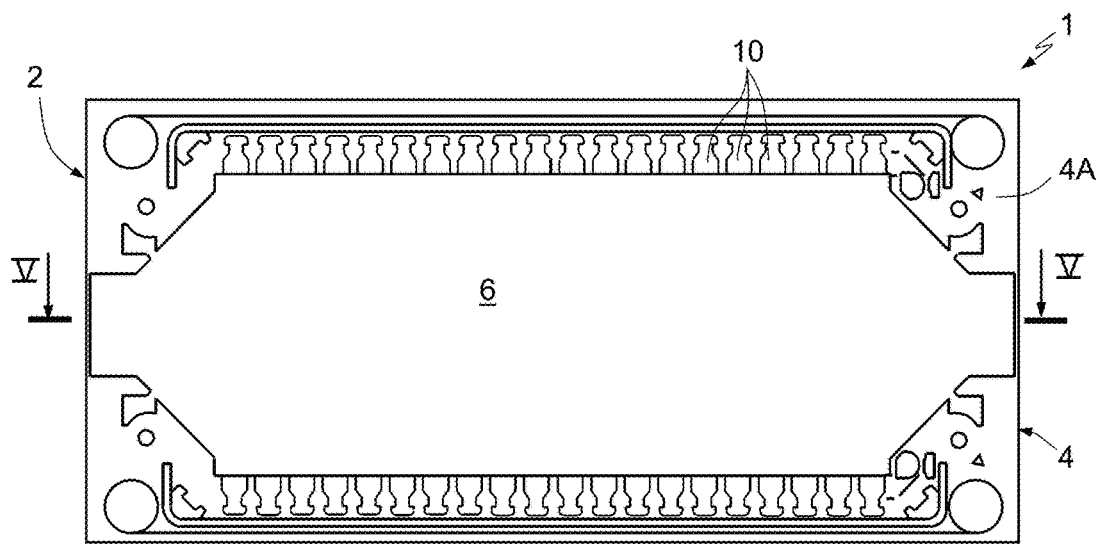
FIG. 1 is a bottom view of the present packaged device.
Figure 2:
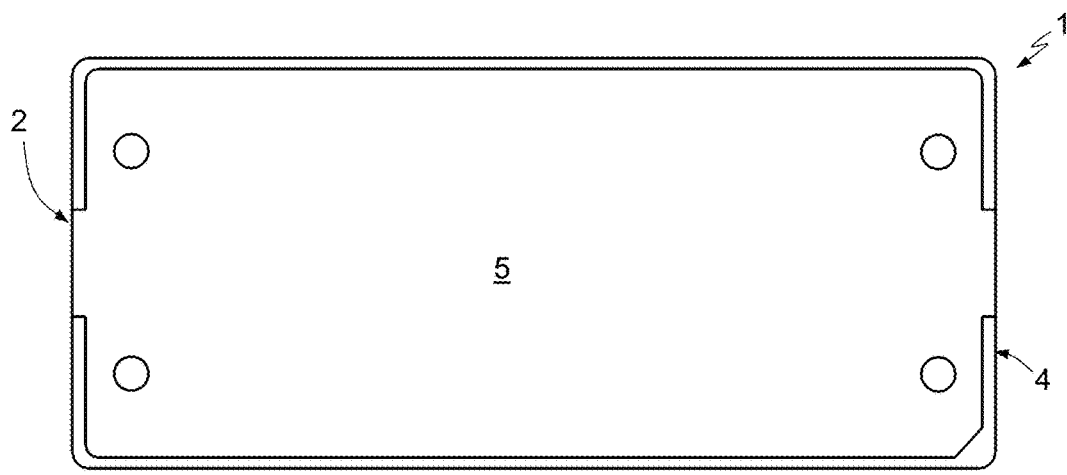
FIG. 2 is a top view of the packaged device of FIG. 1.

FIGS. 1-5 show an embodiment of a packaged device 1.

The packaged device 1 comprises one or more dice 3 of semiconductor material, for example, silicon (Si) or silicon carbide (SiC), contained in a package 2.

In detail, the package 2 comprises an insulating casing 4, for example of plastic material (shown only partially in FIGS. 1, 3, and 4), which surrounds a first dissipative region 5 and a second dissipative region 6; the dissipative regions 5, 6 are connected together through a first and a second connection element. For instance, the connection elements are tubular and are formed, in particular, by a first and a second screw 7, 8. The package 2 defines an inner cavity 30.

Figure 3:
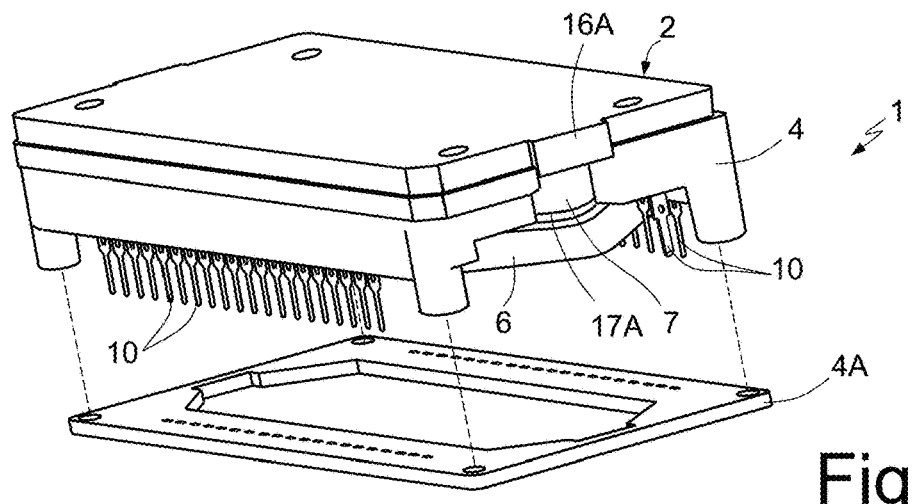
FIG. 3 is a perspective exploded view of the packaged device of FIGS. 1 and 2.

The first dissipative region 5 is designed to form, in use, a top heat-sink support and has an inner face 5A and an outer face 5B. The dice 3 are bonded, typically soldered using a solder paste, on the inner face 5A. The outer face 5B of the first dissipative region 5 is here flush with the casing 4. Alternatively, the first dissipative region 5 may project from the casing 4. The second dissipative region 6 has an inner face 6A and an outer face 6B and is designed to form, in use, a bottom heat-sink support designed to be coupled, via its own outer face 6B, to a supporting board 11, for example a printed-circuit board (FIG. 5). For example, the second dissipative region 6 may be put in contact with a specific copper dissipating plate provided on the supporting board 11. The inner face 6A of the second dissipative region 6 is in contact with a horizontal portion of the casing 4, not visible in the figures. The casing 4 is further closed at the bottom by a bottom wall 4A that surrounds the second dissipative region 6 (FIGS. 1 and 3).

The first and second dissipative regions 5, 6 have a generally parallelepipedal shape elongated in a first direction parallel to a first axis Y of a Cartesian reference system XYZ (FIG. 5), are hollow, and contain at the interior a first and a second chamber 12, 13, respectively. The dissipative regions 5, 6 may be formed by modified leadframes. For example, the first dissipative region 5 may be formed as a DCB (Direct Copper Bonding) substrate, i.e., a triple layer, including a first conductive layer 32, an intermediate insulating layer 33, and a second conductive layer 34, as shown in the detail of FIG. 5A. In particular, the first conductive layer 32 (which forms the outer face 5B of the first dissipative region 5) is intended to be arranged on the outside of the package 2, may be formed by a modified leadframe, for example, of copper, and houses the first chamber 12; the intermediate insulating layer 33 may be of alumina ($Al_2O_3$), having excellent electrical insulation characteristics but no good thermal insulation; and the second conductive layer 34 (forming the inner face 5A of the first dissipative region 5) is intended to be arranged on the inside of the package 2 and is of copper.

The second dissipative region 6 is, instead, formed of a single layer, for example of copper, and may be a modified leadframe.

As may be noted from FIGS. 1-4, the first dissipative region 5 has a generally parallelepipedal shape, with its length arranged parallel to the first axis Y, and the second dissipative region 6 is generally ship-shaped in top view (FIG. 1), with its maximum length that is parallel to the first axis Y and the same as the first dissipative region 5. These shapes are not, however, limiting and may change. Further, the first and second dissipative regions 5, 6 have projecting portions 16A, 16B, 17A, 17B extending from the respective inner faces 5A, 6A, near the respective longitudinal ends, towards the inner cavity 30.

Figure 9:
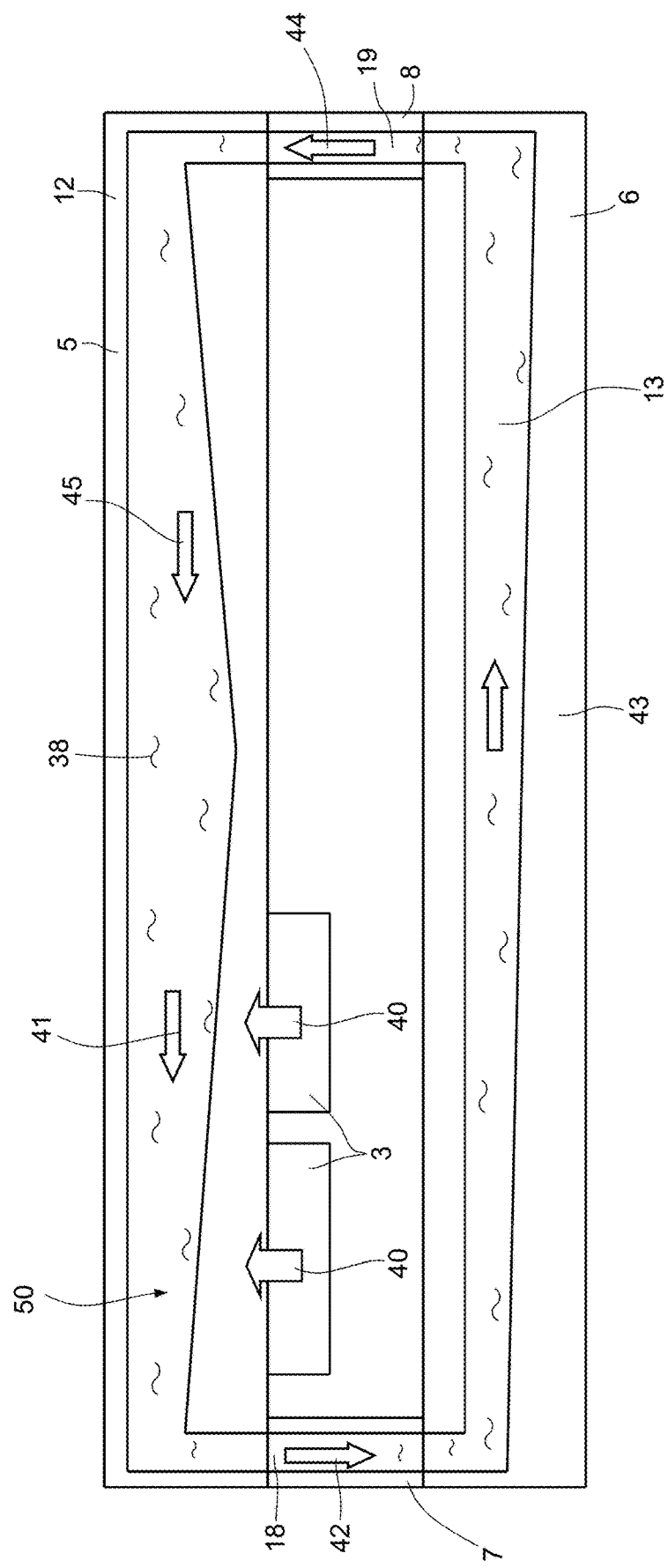
FIG. 9 is a cross-section of the packaged device of FIGS. 1-5, showing the movement of a cooling liquid.

The chambers 12, 13 extend for most of the length and of the width (parallel to a second axis X of the Cartesian reference system XYZ) of the dissipative regions 5, 6. In top view, the chambers 12 and 13 may have a shape similar to the respective dissipative regions 5, 6 and a depth (parallel to a third axis Z of the Cartesian reference system XYZ) that is variable. In detail, the first chamber 12 has a depth increasing from the longitudinal ends and has its maximum in a central portion. For example, in cross-section (FIG. 5), the bottom surface of the first chamber 12 (facing the inner face 5A of the first dissipative region 5) may form two sides of an isosceles triangle with vertex pointing downwards. Instead, the second chamber 13 has a depth linearly increasing from one end towards the opposite end. For example, the bottom surface of the second chamber 13 (facing the outer bottom face 6B of the second dissipative region 6) may define a plane inclined downwards from the end of the second chamber 13 near the first screw 7 and have a maximum depth around the end of the second chamber 13 near the second screw 8, for the reasons discussed hereinafter with reference to FIG. 9.

The dice 3 are generally bonded in a non-central position in the longitudinal direction of the first dissipative region 5. For instance, in FIG. 5 they are arranged in a left-hand half of the first dissipative region 5, directly underneath the first chamber 12.

The chambers 12, 13 are connected to the outside through four holes 14A, 14B, 15A, 15B (FIG. 5). In detail, the first and second holes 14A, 14B extend parallel to axis Z from the longitudinal ends of the first chamber 12 on the inner face 5A through the projecting portions 16A, 16B of the first dissipative region 5. The third and fourth holes 15A, 15B extend parallel to axis Z from the longitudinal ends of the second chamber 13 and through the projecting portions 17A, 17B, vertically aligned to the first holes 14A, 15B.

The screws 7, 8 are hollow, have a first through channel 18 and a second through channel 19, respectively, and extend transversely to the dissipative regions 5, 6 (parallel to the third axis Z). In addition, the screws 7 and 8 have external ends provided with threads 35 (FIGS. 6A, 6B) that engage the holes 14A, 14B, 15A, 15B. In detail, the first screw 7 is screwed in the first and third holes 14A, 15A and the second screw 8 is screwed in the second and fourth holes 14B, 15B so as to fluidically connect the first and second chambers 12, 13 through the through channels 18, 19. Gaskets (not shown) may be provided for ensuring tightness.

For example, the chambers 12 and 13 may have a length (in a parallel direction to axis Y) of 100 mm, a maximum width (in a parallel direction to axis X) of 20 mm; they may further have a minimum depth of 1.8 mm, and a maximum depth of 2 mm.

The through channels 18, 19 in the screws 7, 8 may have a height of approximately 10 mm and a width of 1.8 mm so as to favor capillarity, as explained hereinafter.

A cooling liquid 38, of a known type, is contained in the chambers 12, 13 and the through channels 18, 19.

The second conductive layer 34, forming the inner face 5A of the first dissipative region 5, is generally shaped to form conductive paths. It is connected, through electrical connection plugs, not shown and extending in the inner cavity 30 between the first and second dissipative regions 5, 6, to conductive vias (not shown), formed in the bottom wall 4A of the casing 4, outside the second dissipative region 6, and to leads 10 (represented dashed in FIG. 5), in a per se known manner. Insulating material, for example silicone, may cover the dice 3 and their electrical connections (not shown) in the inner cavity 30, for protection thereof, in a per se known manner.

FIGS. 6A, 6B, 7A, 7B, and 8A, 8B show the packaged device 1 in a simplified way in successive assembly steps.

In detail, FIGS. 6A, 6B, 7A, and 7B show screwing the screws 7, 8 in the holes 14A, 14B, 15A, 15B (not visible in FIGS. 6A, 6B) through respective threaded portions 35, thus fixing the dissipative regions 5, 6 together. In a way not shown, the dice 3 have already been soldered on the inner face 5A of the first dissipative region 5.

After screwing the screws 7, 8 (FIGS. 8A and 8B), the cooling liquid (designated by 38) is introduced into the chambers 12, 13 and into the through channels 18, 19 through an opening (not shown), for example formed in the first dissipative region 12, subsequently closed via sealing material or soldering.

In use (see FIG. 9), the cooling liquid 38 circulates within the hydraulic circuit formed by the chambers 12, 13 and by the through channels 18, 19 (designated as a whole by 50) in an automatic way, by virtue of the shape of the channels, reaching the region of the dice 3 (the temperature whereof may be as high as 100° C.), favored by the capillarity in the through channels 18, 19.

In fact, as indicated by the arrows 40, the heat generated by the dice 3 is absorbed by the cooling liquid 38 in the first chamber 12 in the portion overlying the dice 3, which heats up, decreases in density and receives a thrust upwards (on the basis of Archimedes' law). Since the dice 3 are in a longitudinally eccentric position, shifted to the left in FIG. 9, the cooling liquid 38 tends to move towards the end of the first chamber 12 closer to the dice (towards the left in FIG. 9, as indicated by the arrow 41), favored also by the bottom wall of the first chamber 12, inclined upwards and towards the end.

Then, the cooling liquid 38 passes through the first through channel 18 in a downward direction (arrow 42), starting to yield part of the heat to the first screw 7, of metal and thus thermally conductive. Cooling of the cooling liquid 38 favors the descending movement.

The cooling liquid 38 then proceeds in its movement along the second chamber 13, favored by the shape of the latter, by virtue of a bottom wall inclined downwards in the direction from the first screw 7 to the second screw 8 (arrow 43). In this step, also thanks to the progressive increase in cross-section of the second chamber 13 from left to right, the liquid cools down, yielding heat to the metal paths (not shown) on the supporting board 11 (FIG. 5).

Next, the cooling liquid 38 rises along the second through channel 19, by capillarity and by inertia (arrow 44), and again reaches the first chamber 12. The cooling liquid 38 then advances in the right-hand portion of the first chamber 12, favored by the downward slope of the latter.

Thereby, natural convection creates a movement in the hydraulic circuit 50 that favors heat extraction from the dice 3.

The effectiveness of the cooling process is also shown in FIGS. 10A, 10B, and 11. In particular, FIGS. 10A and 10B (showing the cross-section of the packaged device 1 in perpendicular, transverse planes) represent through arrows 55 the dissipation areas exploited by the cooling liquid 38. As may be noted, these areas comprise practically all the outer surfaces of the packaged device 1, except for the side where the cooling liquid 38 rises within the second screw 8.

The cooling effect is also represented, in shades of grey, in the simulation of FIG. 11, where the lighter areas correspond to hotter areas.

FIG. 12 shows a variant, wherein a heat-sink element 60, of a known type is bonded to the first dissipative wall 5. In this way, the effectiveness of the cooling process increases further.

By virtue of the arrangement of dissipating structures also on different sides of the packaged device 1 and the particular configuration described, the packaged device 1 presents improved thermal functionality as compared to known solutions.

In particular, with the present packaged device 1 it is possible to obtain a reduction of the thermal transients, whether they have fast, medium, or slow evolution, within the dice 3, thus reducing the thermal stresses (AT reduction).

The present packaged device 1 further enables reduction of the mechanical stresses of the system by virtue of the reduction of the operating temperature as well as of the temperature swing; thus, it has improved mechanical characteristics and consequently a higher MTTF (Mean Time To Failure).

The presented solution enables improvement in the efficiency, since the lower operating temperature enables integrated electronic circuits, and in particular switches in power converters, to work with a lower saturation resistance $R_{ds}$(on). In fact, this parameter markedly depends upon the operating temperature and in particular increases as the temperature rises. The reduction of $R_{ds}$(on) on the other hand reduces conduction losses and thus increases the total efficiency of the system.

The new packaging system, which uses a leadframe on both sides of the dice 3 to form the dissipative regions 5, 6, causes a reduction of the parasitic inductances, contributing to reducing the energy dissipated during transients and thus switching losses.

The structure is more compact than the current solutions with cooling box, enabling use of the present packaged device in a wide range of apparatus and applications. Further, for a same dissipation, also the heat sink may be formed with smaller dimensions as compared current solutions.

The reduction of parasitic inductances that may be obtained enables a corresponding reduction of generated electromagnetic interference (EMI).

Finally, it is clear that modifications and variations may be made to the packaged device described and illustrated herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged device, comprising:
   a package including a first dissipative region, a second dissipative region, a first connection element, and a second connection element, and
   a die of semiconductor material within the package, wherein the first and second dissipative regions are on opposing sides of the die, wherein the first and second connection elements are on opposing sides of the die, and
   wherein the first dissipative region, the second dissipative region, the first connection element, and the second connection element are hollow and form a closed channel, the closed channel containing a cooling liquid.

2. The packaged device according to claim 1, wherein the first and second connection elements are hollow tubular elements, each hollow tubular element having first and second threaded ends engaged with the first and second dissipative regions, respectively.

3. The packaged device according to claim 1, wherein the first and second dissipative regions are dissipative plates of an elongated shape, wherein each dissipative plate is provided with a first end and a second end, wherein the first connection element extends transverse to the dissipative plates between the first ends of the dissipative plates, and wherein the second connection element extends transverse to the dissipative plates between the second ends of the dissipative plates.

4. The packaged device according to claim 1, wherein the second dissipative region is coupled to a printed-circuit board.

5. The packaged device according to claim 1, wherein:
   the first and second dissipative regions have a first inner surface and a second inner surface, respectively, the first inner surface of the first dissipative region facing the second inner surface of the second dissipative;
   the first dissipative region accommodates a first chamber of an elongated shape, the first chamber having first and second ends that extend toward the first inner face;

the second dissipative region accommodates a second chamber of an elongated shape, the second chamber having third and fourth ends that extend toward the second inner surface;

the first connection element accommodates a first through channel; and the second connection element accommodates a second through channel, the closed channel including the first chamber, the second chamber, and the first through channel, and the second through channel.

6. The packaged device according to claim 5, wherein a depth of the first chamber increases from the first and second ends toward a middle portion.

7. The packaged device according to claim 6, wherein the second chamber has an increasing depth from the third end towards the fourth end.

8. The packaged device according to claim 6, wherein the die is coupled to the first inner face of the first dissipative region longitudinally eccentric with respect to a longitudinal axis of the first chamber.

9. The packaged device according to claim 8, wherein the die is arranged at an area that is between the first end and the middle portion of the first chamber.

10. A packaged device, comprising
a package including a first dissipative region, a second dissipative region, a first connection element, and a second connection element, and
a die of semiconductor material within the package;
wherein the first and second dissipative regions are spaced from each other by a distance,
wherein the first and second connection elements are spaced from each other and are between the first and second dissipative regions,
the first dissipative region, the second dissipative region, the first connection element, and the second connection element being hollow and forming a closed channel, the closed channel containing a cooling liquid, and
wherein the first dissipative region comprises a multilayer plate including a first layer of thermally conductive material, an intermediate layer of electrically insulating material, and a second layer of electrically conductive material, wherein the first, intermediate, and second layers are arranged stacked relative to each other, wherein the first layer accommodates a first dissipation chamber, the second layer facing the second dissipative region and forming electrically conductive regions, and wherein the die is bonded to the second layer.

11. The packaged device according to claim 10, wherein the multilayer plate comprises a DCB (Direct Copper Bonding) substrate, where the first and second layers are of copper and the intermediate layer is made of alumina.

12. A packaged device comprising
a package including a first dissipative region, a second dissipative region, a first connection element, and a second connection element, and
a die of semiconductor material within the package;
wherein the first and second dissipative regions are spaced from each other by a distance,
wherein the first and second connection elements are spaced from each other and are between the first and second dissipative regions;
the first dissipative region, the second dissipative region, the first connection element, and the second connection element being hollow and forming a closed channel, the closed channel containing a cooling liquid, and
wherein the second dissipative region comprises a plate of electrically conductive material.

13. The packaged device according to claim 4, further comprising a heat sink coupled to the first dissipative region.

14. A packaged device comprising
a package including a first dissipative region, a second dissipative region, a first connection element, and a second connection element, and
a die of semiconductor material within the package;
wherein the first and second dissipative regions are spaced from each other by a distance,
wherein the first and second connection elements are spaced from each other and are between the first and second dissipative regions;
the first dissipative region, the second dissipative region, the first connection element, and the second connection element being hollow and forming a closed channel, the closed channel containing a cooling liquid, and
wherein the package further comprises a casing formed by a plastic box laterally surrounding the first dissipative region, the second dissipative region, the first connection element, and the second connection element.

15. A packaged device, comprising:
a package body including:
first and second dissipative regions;
first and second connection elements between the first and second dissipative regions, the first and second connection elements coupling the first dissipative region to the second dissipative region;
a cavity inside the package body;
a die of semiconductor material in the cavity; and
a channel in the package body, wherein the channel is a closed channel that includes openings in the first and second dissipative regions and openings in the first and second connection elements, wherein the channel extends around the die; and
a fluid in the channel.

16. The packaged device according to claim 15, wherein the first and second connection elements have threaded ends that couple with the first dissipative region and the second dissipative region.

17. The packaged device according to claim 15, wherein the fluid in the channel is a coolant.

18. The packaged device according to claim 15, wherein the die is coupled to an inner surface of the first dissipative region or an inner surface of the second dissipative region.

19. A packaged device, comprising:
a package body including:
first and second dissipative regions, wherein at least one of the first and dissipative regions are multilayered plates;
first and second connection elements between the first and second dissipative regions, the first and second connection elements coupling the first dissipative region to the second dissipative region;
a cavity inside the package body;
a die of semiconductor material in the cavity; and
a channel in the package body, wherein the channel is a closed channel that includes openings in the first and second dissipative regions and openings in the first and second connection elements; and
a fluid in the channel.

20. A device, comprising:
a package body including:
first and second dissipative regions;
first and second connection elements located between the first and second dissipative regions and coupling the first dissipative region to the second dissipative region;

an inner cavity delimited by the first and second dissipative regions and the first and second connection elements;

a die of semiconductor material in the inner cavity;

a closed channel extending through the first and second dissipative regions and the first and second connection elements, the closed channel extending around at least four adjacent sides of the die;

a fluid in the channel; and a printed circuit board, the package body coupled to the printed circuit board.

21. The device according to claim 20, wherein the first and second connection elements have threaded ends that couple with threads of the first and second dissipative regions.

22. A device, comprising:

a package body including:

first and second dissipative regions;

first and second connection elements located between the first and second dissipative regions and coupling the first dissipative region to the second dissipative region;

an inner cavity delimited by the first and second dissipative regions and the first and second connection elements;

a die of semiconductor material in the inner cavity;

a closed channel extending through the first and second dissipative regions and the first and second connection elements, wherein the closed channel has different depths in the first and second dissipative regions and the first and second connection elements;

a fluid in the channel; and a printed circuit board, the package body coupled to the printed circuit board.

23. The device according to claim 22, further comprising a heat sink coupled to the first dissipative region.

* * * * *

UNITED STATES PATENT AND TRADEMARK OFFICE
CERTIFICATE OF CORRECTION

PATENT NO. : 10,756,002 B2
APPLICATION NO. : 16/239333
DATED : August 25, 2020
INVENTOR(S) : Cristiano Gianluca Stella Page 1 of 1

It is certified that error appears in the above-identified patent and that said Letters Patent is hereby corrected as shown below:

In the Claims

Column 6, Line 64, Claim 5:
"dissipative;" should read, --dissipative region;--.

Column 7, Line 52, Claim 12:
"device" should read, --device,--.

Column 8, Line 48, Claim 19:
"first and" should read, --first and second--.

Signed and Sealed this
Sixth Day of October, 2020

Andrei Iancu
*Director of the United States Patent and Trademark Office*